United States Patent [19]

Hanson

[11] 4,133,023
[45] Jan. 2, 1979

[54] FLASH LAMP ARRAY HAVING ELECTRICAL SHIELD

[75] Inventor: James M. Hanson, Euclid, Ohio

[73] Assignee: General Electric Company, Schenectady, N.Y.

[21] Appl. No.: 860,438

[22] Filed: Dec. 14, 1977

[51] Int. Cl.² ............................................. G03B 15/02
[52] U.S. Cl. ...................................... 362/11; 362/13; 362/247; 362/249; 362/346
[58] Field of Search .................... 362/11, 13, 247, 249, 362/346

[56] References Cited

U.S. PATENT DOCUMENTS

| 3,430,545 | 3/1969 | Wick | 362/13 |
|---|---|---|---|
| 3,941,992 | 3/1976 | Blount et al. | 362/13 |
| 4,019,043 | 4/1977 | Blount | 362/13 |
| 4,060,721 | 11/1977 | Hanson et al. | 362/13 |

Primary Examiner—Brooks H. Hunt
Attorney, Agent, or Firm—Norman C. Fulmer; Lawrence R. Kempton; Frank L. Neuhauser

[57] ABSTRACT

A photoflash lamp array comprising a housing elongated vertically and containing elongated flash lamps lying horizontally and stacked vertically, the flash lamps having lead-in wires extending from ends thereof near the sides of the housing and connected to a circuit board located behind the lamps. A conductive sheet-like shield is positioned between the circuit board and the rear of the housing and is contoured to have side portions extending frontwardly and between the lamp ends and the sides of the housing. Electrically insulative flash indicator material is positioned on the front surface of the shield and extends along the inside surfaces of the shield's frontwardly extending portions so as to prevent the lamp's lead-in wires from becoming shorted against the shield.

8 Claims, 4 Drawing Figures

U.S. Patent  Jan. 2, 1979  4,133,023
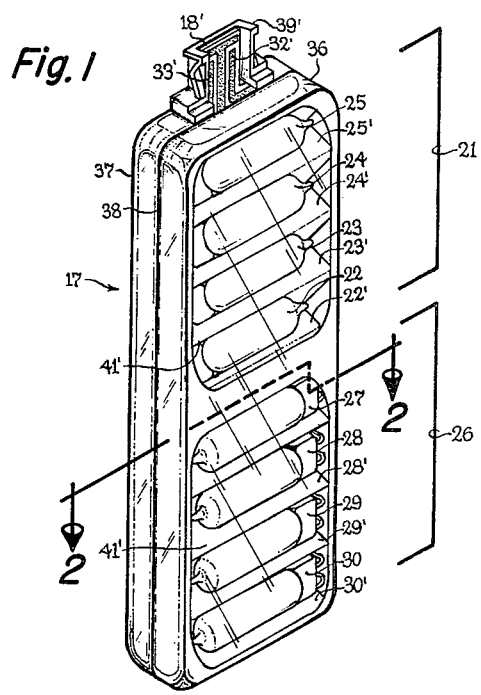
Fig. 1
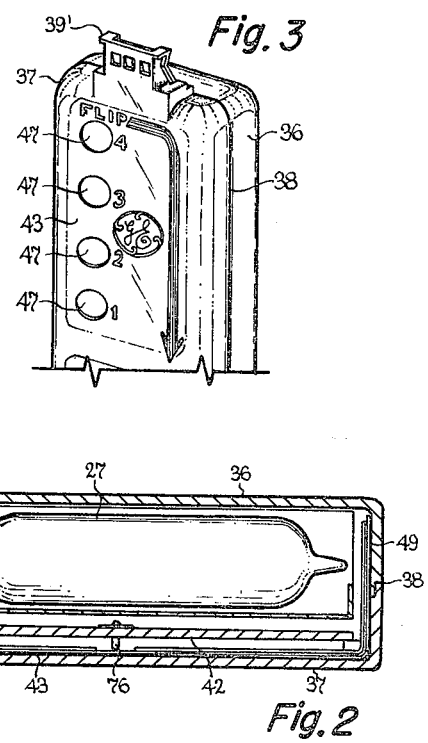
Fig. 3
Fig. 2
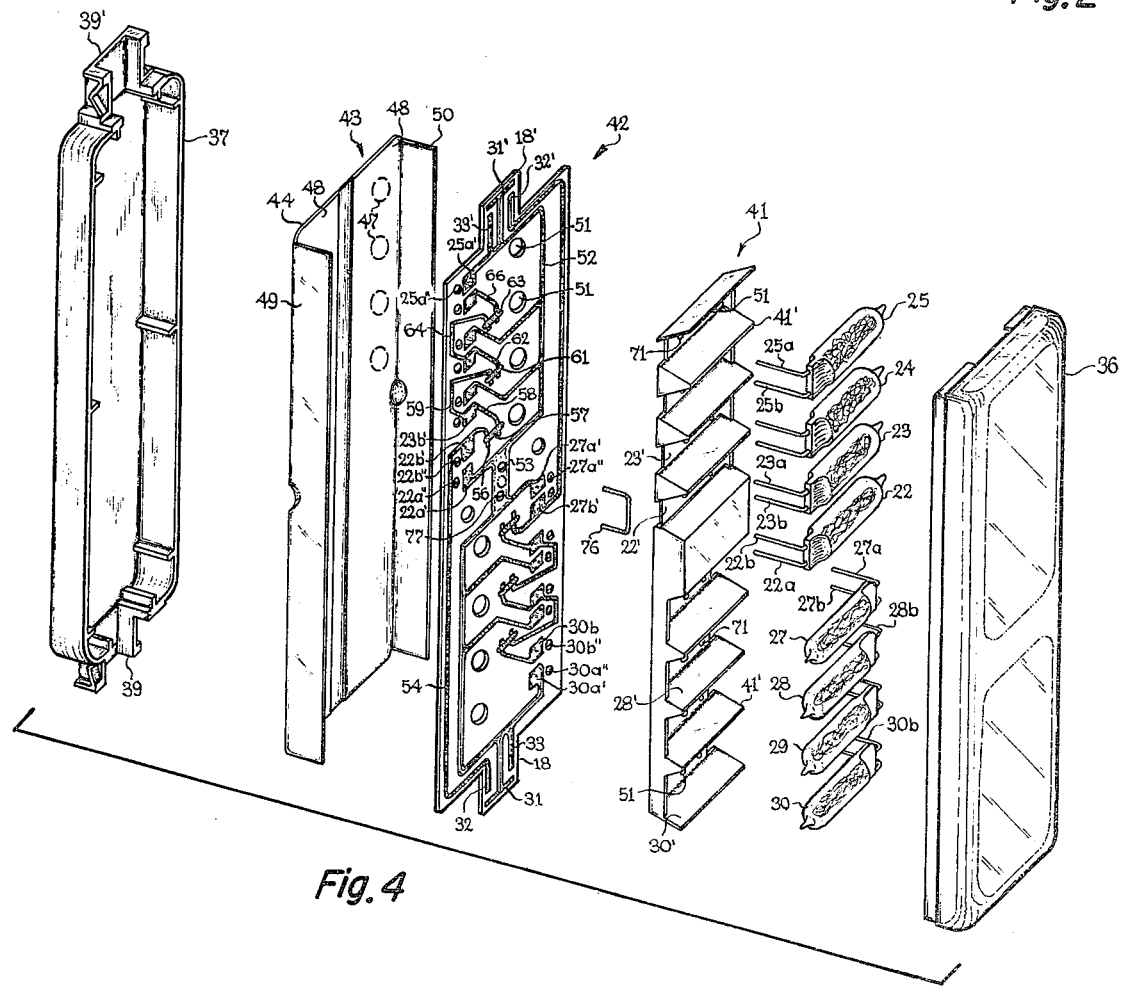
Fig. 4

FLASH LAMP ARRAY HAVING ELECTRICAL SHIELD

CROSS-REFERENCES TO RELATED APPLICATIONS

Ser. No. 825,609, filed Aug. 18, 1977, James M. Hanson, "Photoflash Lamp Array Having Contoured Sheet Shield", assigned the same as this invention.

Ser. No. 843,785, filed Oct. 20, 1977, Harry Atwood, "Photoflash Lamp Array", assigned the same as this invention.

Ser. No. 805,770, filed June 13, 1977, Victor A. Levand and William A. Lenkner, "Photoflash Lamp Array Having Shielded Switching Circuit", assigned the same as this invention.

BACKGROUND OF THE INVENTION

The invention is in the field of multiple photoflash lamp units, such as the FlipFlash type of flash array.

U.S. Pat. No. 4,019,043 to Blount discloses a FlipFlash type of array having a metal foil shield positioned behind the circuit board and connected to electrical ground of the circuit. The metal foil is in the form of a metal coating on a paper indicia sheet which also is provided with flash indicator means for indication which of the lamps have been flashed. The above-referenced Hanson patent application discloses a similar type of flash array, but in which the sheet-like metal shield is contoured to extend frontwardly and flank the flash lamps at the sides of the array to provide additional shielding.

SUMMARY OF THE INVENTION

Objects of the invention are to provide an improved flash array construction, and to provide such a construction which prevents accidental shorting of lead-in wires of the flash lamps.

The invention comprises, briefly and in a preferred embodiment, a photoflash array having a housing elongated vertically and containing elongated flash lamps lying horizontally and stacked vertically, said flash lamps having lead-in wires extending from ends thereof near the sides of the housing and connected to a circuit board located behind the lamps. A conductive sheet-like shield is positioned between the circuit board and the rear of the housing and is contoured to have side portions extending frontwardly and between the lamp ends and the sides of the housing. Electrically insulative flash indicator material is positioned over at least part of the front of the shield and extends along the inside surfaces of the shield's frontwardly extending portions so as to prevent the lamp's lead-in wires from becoming shorted against the conductive shield.

BRIEF DESCRIPTION OF THE DRAWING

FIG. 1 is a perspective view of a multiple flash lamp array in accordance with a preferred embodiment of the invention.

FIG. 2 is a cross-sectional view of FIG. 1, taken on the line 2—2 thereof.

FIG. 3 is a perspective rear view of part of the flash array.

FIG. 4 is an exploded perspective view of the flash array.

DESCRIPTION OF THE PREFERRED EMBODIMENT

A vertically elongated multiple flash lamp unit 17 of the planar array type and containing a plurality of electrically fired flash lamps is provided with a plug-in connector tab 18 at the lower end thereof, adapted to fit into a socket of a camera or flash adapter as shown and described in the above-referenced patent. The lamp array 17 is provided with a second plug-in connector tab 18' at the top end thereof, whereby the array 17 is adapted to be attached to the camera socket in either of two orientations, i.e., with either the tab 18 or the tab 18' plugged into the socket. The array 17 is provided with an upper group 21 of elongated flash lamps 22, 23, 24, and 25, lying horizontally and stacked vertically, and a lower group 26 of flash lamps 27, 28, 29, and 30, lying horizontally and stacked vertically, all of the lamps being arranged in a planar configuration. Reflectors 22', etc., are disposed behind and partly around the respective flash lamps, so that as each lamp is flashed its light is projected forwardly of the array 17. The lamps are arranged and connected so that when the array is connected to a camera by the connector 18, only the upper group 21 of the lamps will be flashed, and when the array is turned end for end and connected to the camera by the other connector 18', only the then upper group 26 of lamps will be flashed. By this arrangement, only lamps relatively far from the lens axis are flashable, thus reducing the undesirable red-eye effect, as is more fully described in the above-referenced patents.

The general construction of the array comprises front and back housing members 36 and 37, which preferably are made of plastic. In the preferred embodiment shown, the front and back housing members are joined together at their sides as indicated by the seam line 38, and the back housing member 37 includes integral extensions 39 and 39' at the ends thereof which partly surround and protect the connector tabs 18 and 18' and also function to facilitate mechanical attachment to the camera socket. Sandwiched between the front and back of the housing members 36 and 37, in the order named, are the flash lamps 22, etc., a unitary reflector and barrier member 41 (preferably of white plastic) shaped to provide the individual reflectors 22', etc. and barriers 41' between adjacent lamps to prevent sympathetic flashing of a lamp when an adjacent lamp is flashed, a printed circuit board 42 provided with integral connector tabs 18 and 18', and a combined shield and indicia sheet 43 which may be provided with instructions, information, and other indicia such as flash indicators 47 located behind the respective lamps and which change color due to heat and/or light radiation from a flashing lamps, thus indicating at a glance which of the lamps have been flashed and not flashed.

The indicia sheet 43 may be of paper or thin cardboard 44 coated with a layer of metal 45, such as aluminum, on its front or inner surface, and provided with openings where the flash indicators 47 are desired, and flash indicator material 48, such as a sheet-like heat sensitive plastic material, for example biaxially oriented polypropylene, which shrinks or melts when subjected to heat or radiant energy from an adjacent flashing lamp, is positioned over the openings for the flash indicators 47 thus effectively changing the color at these openings when the adjacent lamps are flashed. For example, the plastic material can be colored green on its back side by ink or other suitable means, and the green disappears when the opening becomes a different color (dark, for example) when the plastic shrinks or melts away due to heat from an adjacent flashing lamp. The front of the plastic (toward the lamps) should be coated with dark ink so as to absorb heat more readily. One or more flash indicator sheets 48 may be arranged over portions of the metal coating 45 to cover over all of the flash indicator openings. Window means 51 in the form of openings or transparent areas are provided through the reflector and barrier unit 41 and the circuit board 42 to facilitate radiation from flashing lamps reaching the flash indicators 47. The metal coating 45 functions as a shield and extends onto frontwardly bent side portions 49, 50 of the indicia sheet 43 to provide shielding at the sides of the array and flanking the flash lamps, as is disclosed in the above-referenced Hanson patent application. The rear housing member 37 is transparent (either of clear material or provided with window openings) to permit viewing of the indicia on the indicia sheet 43. The front housing member 36 is transparent at least in front of the lamps 22, etc., to permit light from flashing lamps to emerge frontwardly of the array, and may be tinted to alter the color of light from the flash lamps and also may be provided with lenses or prisms for controlling the light distribution pattern.

The height and width of the rectangular array are substantially greater than its thickness, and the heights and widths of the reflector and barrier member 41 and circuit board 42 are substantially the same as the interior height and width of the housing members, to facilitate holding the parts in place.

The reflector and barrier member 41 is a one-piece member, preferably of molded white plastic interspersed with titanium dioxide, shaped to provide the reflectors 22' etc. in the form of planar rear portions 22a', etc. behind the respective lamps, and the tapered reflector sides 22b', etc. between adjacent lamps which also form the barriers 41' for preventing sympathetic flashing by which a lamp adjacent to a flashing lamp could be caused to flash due to heat and/or light radiation from the flashing lamp.

The tab 18, which is integral with the circuit board 42, is provided with a pair of electrical terminals 31 and 32, and similarly the tab 18' is provided with a pair of terminals 31' and 32', for contacting terminals of a camera socket for applying firing voltage pulses to the array. The terminals 31 and 31' are connected together and to a lead-in wire of each lamp, and constitute part of the electrical ground circuit of the array. Each tab is provided with a third terminal 33 and 33', respectively, which is connected respectively to the terminals 31 and 31', as disclosed in the above-referenced Atwood application. Alternatively, these third terminals can be connected to the opposite group of lamps and circuits as disclosed in U.S. Pat. No. 3,952,320 to Blount. The terminals 31 and 31' are shown as having a lateral "T-bar" configuration for temporarily shorting the socket terminals while the array is being plugged in, to discharge any residual voltage charge in the firing pulse source and also to reduce the likelihood of lamps being accidentally flashed by electrostatic voltage when the array is handled, as is disclosed in U.S. Pat. No. 3,980,876 to Cote.

The circuit board 42 has a "printed circuit" thereon, as will now be described, for causing sequential flashing of the lamps by firing voltage pulses applied to the terminals 31, 32 or 31', 32'. The top and bottom halves of the printed circuitry preferably are reverse mirror images of each other. In the preferred embodiment shown, a pair of printed circuit pads 22a' and 22b' are provided on the circuit board, to which the lead-in wires 22a and 22b of lamp 22 are to be connected. Similarly, circuit pads 23a' and 23b' through 25a' and 25b', and 27a' and 27b' through 30a' and 30b' are provided for connection to the lead-in wires of the remaining lamps, the numbers and letters in the circuit pad designations corresponding to those of the lamp lead-in wires. The circuit pads for the group 21 of lamps are aligned in a row near one edge of the circuit board, and the circuit pads for the other group 26 of lamps are aligned in a row near the other edge of the circuit board and on the opposite half of the board. The respective lead-in wires 22a, 22b, etc. of the lamps may be attached to the connector pads 22a', 22b', etc. in various ways, such as being ultrasonically driven into the circuit board and against the appropriate connector pads as disclosed in U.S. Pat. No. 4,028,798 to Bechard et al. In this technique, openings 22a" and 22b", etc. are provided through the circuit board through or adjacent to the connector pads 22a' and 22b', etc. The lead-in wires 22a and 22b, etc. of the flash lamps are placed through the respective openings 22a" and 22b", etc. from the front of the circuit board, are laid on the back of the circuit board, and are driven by ultrasonic drivers into the board to make electrical and mechanical contact with the respective circuit pads 22a' and 22b', etc. As shown the flash lamp lead-in wires emerge from each elongated bulb at an end thereof and with the lamps positioned horizontally and stacked vertically their lead-in wires are near a side of the array and are bent approximately as shown in FIG. 2 for connection to the respective adjacent circuit pads. All of the "a'" circuit pads are connected electrically together and to the common electrical ground connector terminals 31 and 31', by a circuit run 52 which includes a ground pad area 53 at the center of the circuit board. The "electrically hot" connector terminal 32 is connected via a circuit run 54 to the circuit pad 22b' and to a radiation switch terminal 56. A radiation activated switch 57 is connected across and between the switch terminal 56 and a switch terminal 58 which connects to the next "hot" lamp circuit pad 23b'. Similarly, a switch terminal 59 is connected to the lamp pad 23b', and a radiation activated switch 61 is connected across and between the terminal 59 and a switch terminal 62 which is connected to the lamp pad 24b'. A third radiation activated switch 63 is connected across and between a circuit run terminal 64 connected to pad 24b' and a circuit run terminal 66 connected to the lamp pad 25b'. The radiation activated switches 57, 61, and 63 are respectively located behind the lamps 22, 23, and 24, and initially have a high impedance such as several thousand ohms or over a million ohms. Window means 71 such as transparent sections or openings through the back of the reflector-barrier unit 41 permit light and heat radiation from the flash lamps, when flashed, to reach the radiation switches and convert them to zero or low impedance such as a few hundred ohms so as to connect the "hot" connector terminal 32 to the next lamp to be flashed. A suitable material for the radiation switches is silver oxide dispersed in a binder such as polyvinyl resin. Another suitable radiation switch material is disclosed in U.S. Pat. No. 3,990,832 to Smialek et al. Each of these radiation switches, upon receiving heat and/or light radiation from the adjacent lamp when it is flashed, changes from an open circuit or high resistance to a closed circuit or low resistance between its switch terminals on the circuit board.

As has been explained, the lower portion of the circuit board contains a substantially reverse mirror image of the same circuit shown in the upper part of the circuit board, and therefore will not be described in detail. It will be noted that the circuit runs from the plugged-in terminals 31 and 32 at the lower part of the circuit board extend upwardly so as to activate the circuitry in the upper half of the circuit board. Similarly, when the unit is turned around and tab 18' is plugged into a socket, the circuit board terminals 31' and 32' will be connected to and activate the lamps which then will be in the upper half of the circuit board, and hence in the upper half of the flash unit 17. This accomplishes, as has been stated, the desirable characteristic whereby only the group of lamps relatively farthest away from the lens axis will be flashed, thereby reducing or eliminating the undesirable red-eye effect. For convenience in laying out the circuit board runs, the pads 22a' and 22b' of lamp group 21, and pads 27a' and 27b' of lamp group 26, are relatively reversed with respect to the other pads of the respective groups.

The circuit on the circuit board 42 functions as follows. Assuming that none of the four lamps in the upper half of the unit 17 have been flashed, upon occurrence of a first firing pulse applied across the terminals 31, 32, this pulse will be directly applied to the lead-in wires of the first-connected flash lamp 22, whereupon the lamp 22 flashes and becomes an open circuit between its lead-in wires. Head and/or light radiation from the flashing first lamp 22 causes the adjacent radiation switch 57 to become a closed circuit (or a low value of resistance), thereby connecting the circuit board terminal 32 electrically to the lead-in wire 23b of the second lamp 23. By the time this occurs, the firing pulse has diminished to a value insufficient to cause the second lamp 23 to flash. When the next firing pulse occurs, it is applied to the lead-in wires of the second lamp 23, via the now closed radiation switch 57, whereupon the second lamp 23 flashes, thereby causing radiation switch 61 to assume zero or low resistance and the second lamp 23 now has an open circuit or high resistance between its lead-in wires. When the next firing pulse occurs, it is applied via now closed radiation switches 57 and 61 (in series) to the third lamp 24, thereby firing the lamp which becomes an open circuit, and the radiation from it causes the radiation switch 63 to become essentially a closed circuit across its terminals. Thus, the next firing pulse will be applied, via now closed radiation switches 57, 61, and 63 (in series) to the lead-in wires of the fourth flash lamp 25, thereupon causing the lamp to flash. Since this lamp is the last lamp in the active circuit, it does not matter whether its lead-in wires are an open or closed circuit after flashing. Additional flash lamps, radiation switches, and electrical conductors can be employed, if desired, using the just described principles. When the flash unit is turned around the other connector table 18' attached to the camera socket, the group of lamps that then become uppermost and relatively farthest away from the lens axis will be in an active circuit and will be flashed in the same manner as has been described. In a preferred embodiment, the lamps 22, etc., are high voltage types, requiring about 2000 volts for example, at low current, for flashing, and they can be fired by impacting or stressing a piezoelectric element in the camera.

A wire staple 76 is placed through openings 77 through the circuit board at the electrical ground pad 53, and its projections at the rear of the board are curved along the rear surface of the board and contact against the conductive shield member 45, thus electrically connecting the shield 45 to the electrical ground of the circuit, as is disclosed in the above-referenced Levand et al patent application.

The rear metal shield 45 extends frontwardly to the front edges of the indicia sheet sides 49 and 50 and can extend as far frontwardly as permitted by the housing, and flanks the sides of the flash lamps 22 etc. to provide effective shielding at the sides of the array, as disclosed in the above-referenced Hanson patent application.

In accordance with the present invention, the plastic flash indicator material 48 extends alongside the inner surfaces of the metal shield 45 frontwardly extending portions which flank the flash lamps a sufficient distance so as to provide electrical insulation between the flash lamp lead-in wires 22a, 22b, etc. and the metal shield 45 in order to avoid accidental short-circuiting of the "hot" lamp lead-in wires 22b, etc. to the metal shield 45 which would prevent proper functioning of the lamps and the lamp firing sequencing circuitry. This arrangement is shown in detail in FIG. 2, in which the lamp 27 lead-in wires, and particularly the "electrically hot" lead-in wire 27b, are closely adjacent to, but are electrically insulated from, the conductive ground shield 45, by the plastic indicator sheet material 48.

All of the lead-in wires of the flash lamps preferably are generally contoured substantially as shown for the lead-in wire 27b in FIG. 2. Due to normal variations in manufacturing, it is unlikely that all of the "hot" lead-in wires of the lamps will be sufficiently equally close to the metal shield 45 so as to all be short-circuited but for the present invention. The present invention achieves its useful purpose of preventing shorting and resulting failure of lamps to flash, by preventing shorting of any of the "hot" lamp lead-in wires which would be touching the metal shield or which would be close enough thereto to permit arcing of the high voltage firing pulse between the lead-in wire and the metal shield so that insufficient energy enters the lamp to fire it.

The invention achieves its objectives of preventing shorting and malfunctioning of flash lamps, and does so in a way that is feasible and economical to manufacture and which permits the use of a compact housing that is only slightly wider than the lengths of the lamps.

While preferred embodiments of the invention have been shown and described, various other embodiments amd modifications thereof will become apparent to persons skilled in the art, and will fall within the scope of the invention as defined in the following claims.

What I claim as new and desire to secure by United States Letters Patent is:

1. A multiple flash lamp array comprising a vertically elongated circuit board having circuitry for sequentially firing flash lamps and a plurality of elongated flash lamps of the electrically fired type positioned over the front of said circuit board and lying horizontally and stacked vertically and having lead-in wires at the side ends thereof connected electrically to said circuitry, and an electrically conductive shield in the form of a conductive sheet member positioned behind and substantially parallel to said circuit board, said shield being provided with side portions extending frontwardly of said circuit board and substantially flanking said flash lamps, wherein the improvement comprises electrically insulative flash indicator material on the inside surface of said shield and extending on said side portions thereof to insulate said lead-in wires from said shield.

2. An array as claimed in claim 1, in which said circuitry includes an electrical ground, and means connecting said shield to said electrical ground.

3. An array as claimed in claim 2, in which a lead-in wire of each of said lamps is connected to said electrical ground.

4. An array as claimed in claim 3, in which said array is provided with a pair of connector terminals arranged so that a first of said terminals is more readily touched than the second of said terminals when said array is handled, and means connecting said first terminal to said electrical ground.

5. An array as claimed in claim 1, in which said shield comprises a sheet of paper having a layer of metal on the inside surface thereof.

6. An array as claimed in claim 5, in which said circuitry includes an electrical ground circuit run, and a conductor connected electrically to said ground circuit run and extending rearwardly of said circuit board and in contact against said shield.

7. An array as claimed in claim 1, including a plastic reflector unit positioned behind said lamps and in front of said circuit board.

8. An array as claimed in claim 1, including a substantially rectangular housing enclosing said flash lamps, said circuit board, and said shield, said housing having a pair of sides flanking said flash lamps, said circuit board, and said shield, said side portions of the shield being substantially coextensive with said sides of the housing.

* * * * *